United States Patent [19]
Pascucci

[11] Patent Number: 5,864,500
[45] Date of Patent: Jan. 26, 1999

[54] AUTO-SAVING CIRCUIT FOR PROGRAMMING CONFIGURATION ELEMENTS IN NON-VOLATILE MEMORY DEVICES

[75] Inventor: Luigi Pascucci, Sesto San Giovanni, Italy

[73] Assignee: SGS-Thomson Microelectronics, S.r.l., Agrate Brianza, Italy

[21] Appl. No.: 835,296

[22] Filed: Apr. 7, 1997

[30] Foreign Application Priority Data

Apr. 5, 1996 [EP] European Pat. Off. ............. 96830191

[51] Int. Cl.$^6$ .................................................. G11C 11/34
[52] U.S. Cl. ................................. 365/185.09; 365/189.09
[58] Field of Search ........................... 365/189.09, 185.09

[56] References Cited

U.S. PATENT DOCUMENTS

| | | | |
|---|---|---|---|
| 3,676,717 | 7/1972 | Lockwood | 307/304 |
| 5,379,249 | 1/1995 | Salmon | 365/201 |
| 5,740,110 | 4/1998 | Madurawe | 365/185.25 |

FOREIGN PATENT DOCUMENTS 0 666 572 A1  8/1995  European Pat. Off. ........ G11C 16/04

*Primary Examiner*—David Nelms
*Assistant Examiner*—Michael T. Tran
*Attorney, Agent, or Firm*—David V. Carlson; Frederick M. Fliegel; Seed and Berry LLP

[57] ABSTRACT

The present invention concerns an auto-saving circuit for programming configuration elements of non-volatile memory cells organized in a cells matrix in a memory device integrated on a semiconductor. The auto-saving circuit is inserted between a first and a second power supply reference voltage and is powered also by programming voltages generated inside the memory device to produce at an output programming signals of the configuration elements. The auto-saving circuit includes a first and a second circuit portion, one for each signal output and each powered by a respective programming voltage and each including a switching network with at least one high threshold transistor and decoupling elements to give inertia to the circuit against electrostatic discharges or accidental power supply variations.

20 Claims, 5 Drawing Sheets

AUTO-SAVING CIRCUIT FOR PROGRAMMING CONFIGURATION ELEMENTS IN NON-VOLATILE MEMORY DEVICES

TECHNICAL FIELD

The present invention relates to an auto-saving circuit for programming configuration elements in non-volatile memory devices.

BACKGROUND OF THE INVENTION

As known, in the provision of non-volatile memory devices, e.g., of the EPROM and flash EPROM type, there are used certain techniques to obviate the low yield of the production process.

These techniques consist of providing a non-volatile memory cells matrix with additional rows or columns—termed redundant—which can be used to replace defective rows or columns which display malfunctions subsequent to testing of the memory device.

The function of the redundant elements is basic for the reliability of the memory device.

Those skilled in the art know the design methodology and the use of redundant rows and columns, of trimming networks and propagation control and of UPROM cells and the related selection circuitry. The latter allows readdressing the memory in such a manner as to replace the addresses containing defective bits with those containing functioning bits present in the redundant rows or columns.

For example, a UPROM cell is programmed in the testing phase, i.e., at the time the memory devices are subjected to an EWS (Electrical Wafer Sort). Before performing any kind of operation on the memory device the cells of the UPROM circuitry which will permit correctly addressing the memory addresses to be replaced are read.

The redundant elements are necessarily of the non-volatile type and are divided in two large groups, i.e., those modifiable as needed, e.g., EEPROM, and those modifiable only once such as, for example, electrically programmable fuses, PROM cells, etc.

The redundant elements thus allow reconfiguration of a non-volatile memory displaying malfunctions and may be defined as configuration elements. It is clear however that to fulfill their function the configuration elements must be whole and not display defects in turn.

It may happen that such configuration elements undergo accidental modifications due to undesired and unforeseeable events such as, for example, falls or overshoots of the power supply voltage or electrostatic discharges. These phenomena are known as 'soft writing' of the configuration elements, for example the UPROM cells.

It is clear that if a configuration element of the modifiable only once type is damaged by an electrostatic discharge the characteristics of the related memory device can even be modified permanently and its functionality is compromised.

SUMMARY OF THE INVENTION

It is therefore an object of the present invention to give a particular protection to the configuration elements and, specifically, to the circuitry assigned to their modification or programming.

According to principles of the present invention, an auto-saving circuit is provided for configuration elements of a non-volatile memory cells matrix, the auto-saving circuit having structural and functional characteristics such as to allow adequate protection of the configuration elements from accidental events which could compromise their status and functionality.

This would allow overcoming the limitations and short-comings of the solutions proposed by the prior art for memory devices produced currently.

In one embodiment, the present invention is directed to a circuit for protecting from accidental changes configuration elements of non-volatile memory cells organized in a cells matrix in a memory device integrated on a semiconductor with said circuit being positioned between a first and a second reference power supply voltage and being powered also by programming voltages generated inside the memory device to produce at the output, programming signals of said configuration devices.

The characteristics and advantages of the method in accordance with the present invention are set forth in the description of an embodiment thereof given below by way of non-limiting examples.

DETAILED DESCRIPTION OF THE INVENTION

Figure 1:
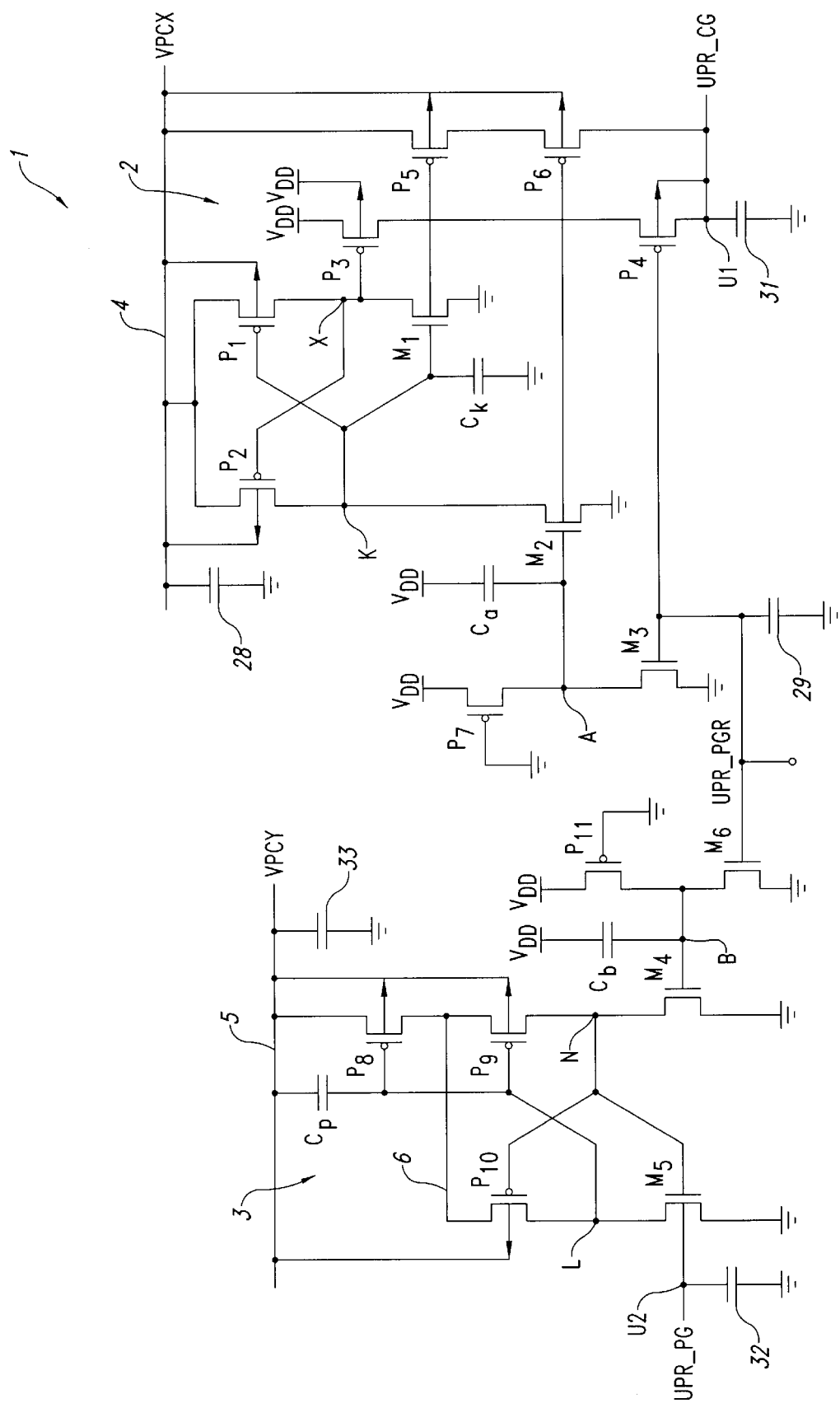
FIG. 1 shows a diagrammatic view of a first auto-saving circuit provided in accordance with an embodiment of the present invention for the programming of configuration elements 41 in a non-volatile memory device.

This application is related to a U.S. patent application titled "CIRCUIT FOR THE SWITCHING OF SUPPLY VOLTAGES IN ELECTRICALLY PROGRAMMABLE AND CANCELABLE NON-VOLATILE SEMICONDUCTOR MEMORY DEVICES," Ser. No. 08/835,294, filed on Apr. 17, 1997, the same applicant, for which priority is claimed based on the European patent application no. 96830193.7 filed on Apr. 5, 1996, and which is incorporated herein by reference:

With reference to FIG. 1 indicating as a whole and diagramatically the structure of an auto-saving circuit 1 provided in accordance with an embodiment of the present invention for the programming of configuration elements 41 in a non-volatile memory device.

The circuit 1 is integrated in a flash semiconductor memory device comprising a memory cells matrix organized in rows and columns. With the memory cells matrix is associated a conventional control, selection and decoding circuit (not shown since they are connected).

The configuration elements 41 for which the circuit 1 is designed can be of various types. In one embodiment, these elements 41 are UPROM redundant cells of conventional structure positioned between a first reference power supply voltage Vcc and a second reference voltage GND, for example a signal ground.

Figure 5:
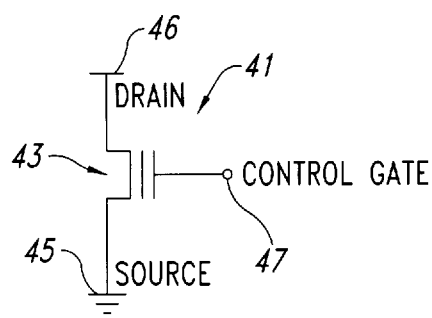
FIG. 5 is an example of one configuration element for receiving the output of the circuits of FIGS. 1–4.

It is useful to recall briefly and in general terms the typical structure and operation of a UPROM cell as shown in FIG. 5. It normally comprises a memory element represented by a floating-gate cell 43 of the EPROM, EEPROM, or flash type which contains a binary code of an address to be saved. This is usually for the purpose of storing the address of a redundant column or word line as is well-known in the art. If a floating-gate cell 43 is used for element 41, it has a source terminal 45, usually directly connected to a ground terminal line, while another conduction terminal, such as a drain terminal 46, is connected to a power supply voltage line through a complementary pair of MOS transistors. The control gate 47 is connectable to various voltage levels as needed. Different voltages are selectably connectable to the terminals 45, 46 and 47 depending on the operation to be carried out on the floating gate cell 43. For example, if programming is to be carried out, a high voltage, such as 8 volts, 12 volts or 20 volts may be connected to the drain or control gate depending on the type of memory cell and the type of programming to be carried out. Similarly, a negative voltage or a high voltage may be applied to the source depending on the operation to be carried out, whether erasure, programming or other operation. The control and operation of such configuration elements 41 are well-known in the art depending on the type of configuration element used. The circuit according to the present invention provides the voltages to the respective terminals to ensure that the voltage on the respective terminals and thus the data in the memory cells will not be affected by any noise or transients in the system but can be changed under the appropriate control as taught herein.

One of the transistors of the complementary pair is connected to the drain terminal of the floating-gate cell in a configuration with source follower. On the control gate of the cell is applied a programming signal UPR-CG while on the control terminal of the above mentioned transistor is applied a programming voltage UPR-PG. Any type of memory cell to be programmed can be biased on this memory cell.

The circuit 1 in accordance with one embodiment of the present invention generate the programming signals UPR-CG and UPR-PG using a circuit configuration that ensures the cells will not be accidentally erased.

The circuit 1 of FIG. 1 comprises a first circuit portion 2 and a second circuit portion 3. The first and second circuit portions 2 and 3 are provided respective and distinct programming power supply voltages Vpcx and Vpcy.

In particular, the first circuit portion 2 is positioned between a power supply line 4 with a voltage Vpcx, and to a power supply terminal, ground GND. Between the line 4 and the ground GND is positioned a natural capacitor 28 for protection from power supply jumps.

The voltage Vpcx is generated inside the memory device to provide power to the rows of the cells matrix in a programming phase.

The second circuit portion 3 is positioned between a power supply line 5 with a voltage Vpcy and a power supply voltage, ground GND. Between the line 5 and the ground GND is positioned a natural capacitor 33 for protection from power supply jumps.

The voltage Vpcy is generated inside the memory device to power in a decoding phase a plurality of control terminals of respective selection transistors present on columns of the cells matrix.

The voltages Vpcx and Vpcy are generated from a programming voltage Vpp supplied from outside the memory device or from any other appropriate voltage supply. In some embodiments, the voltage Vpp is generated on the chip. A power supply voltage Vdd is also connected to the circuit 1. The voltages Vpcx and Vpcy can be any value needed for control of the configurable element 41.

The first circuit portion 2 comprises a switching network with transistors having centrally two complementary pairs of transistors with crossed connection.

A first pair comprises a transistor P1 of the PMOS type connected to the line 4 which has the Vpcx voltage and a transistor M1 of the NMOS type connected to the ground GND.

A second pair comprises a transistor P2 of the natural PMOS type with a high threshold and being connected to the line 4 which has the Vpcx voltage and a transistor M2 of the NMOS type connected to the ground GND.

The PMOS transistors P1 and P2 of the first and second pairs have respective body terminals connected to the Vpcx voltage, that is to the line 4.

An interconnection node X between the transistors P1 and M1 of the first pair is connected to a control terminal of the transistor P2 of the second pair. An analogous connection is provided between an interconnection node K of the second pair P2 and M2 and both of the control terminals of the transistors P1 and M1 of the first pair.

A decoupling capacitor Ck is connected between the node K and the ground GND.

The first circuit portion 2 also comprises a series connection of two high-resistance PMOS transistors P3 and P4 connected between the power supply voltage Vdd and an output terminal U1. Between the output terminal U1 and the ground GND there is a capacitor 31. On the output terminal U1 is produced the programming signal UPR-CG.

The first of these transistors P3 is in diode configuration with a body terminal connected to the power supply voltage Vdd and also includes a control terminal connected to the node X.

The second transistor P4 has a body terminal connected to the output terminal U1 and a control terminal connected to a control terminal of an NMOS transistor M3 having a source grounded. The control terminal of the transistor M3 receives a UPR-PGR activation signal and is connected to the ground GND through a capacitor 29.

The transistor M3 forms a third complementary pair of transistors with a PMOS transistor P7 connected to the power supply voltage Vdd and having a control terminal connected to the ground GND.

An interconnection node A between the transistors M3 and P7 is connected with a control terminal of the transistor M2 of the second pair. Connected between the node A and the power supply voltage Vdd is provided a rise-up capacitor Ca.

The structure of the first circuit portion 2 is completed by a pair of transistors P5 and P6 connected in series together in diode configuration between the line 4 and the output terminal U1. A control terminal of the transistor P5 is connected in common with that of the transistor M1 driven by the node K while a control terminal of the transistor P6 is connected in common with that of the transistor M2 driven by the node A.

The second circuit portion 3 is now discussed in detail.

This portion, too, comprises a network of transistors with a double complementary pair of transistors arranged centrally.

A fourth pair comprises a PMOS transistor P10 connected to a line 6 branched from the line 5 having the voltage Vpcy and an NMOS transistor M5 connected to the ground GND. The line 6 is connected to the line 5 through a transistor P8 of the natural PMOS type with a high threshold and also having a body terminal connected to the line 5.

A decoupling capacitor Cp is connected between the line 5 and a control terminal of the transistor P8.

A fifth pair comprises a transistor P9 of the natural PMOS type with a high threshold and connected to the line 6 and a transistor M4 of the NMOS type connected to the ground GND.

The PMOS transistors P9 and P10 of the fifth and fourth pairs have respective body terminals connected to the voltage Vpcy, i.e., to the line 5.

An interconnection node L between the transistors P10 and M5 of the fourth pair is connected both to a control terminal of the transistor P9 of the fifth pair and to the control terminal of the transistor P8. An analogous connection is provided between an interconnection node N of the fifth pair P9, M4 and a control terminal of each of the transistors P10 and M5 of the fourth pair.

The second circuit portion 3 comprises an output terminal U2 which is connected with the control terminal of the transistor M5. On the output terminal U2 is produced the programming signal UPR-PG. Between the output terminal U2 and the ground GND there is a connected capacitor 32.

A control terminal of the transistor M4 is driven by an interconnection node B of a sixth complementary pair of transistors made up of an NMOS transistor M6 having a source connected to the ground GND and of a transistor P11 of the PMOS type connected to the reference power supply voltage Vdd and having a control terminal connected to the ground GND. Between the node B and the reference power supply voltage Vdd there is connected a rise-up capacitor Cb.

On a control terminal of the transistor M6 is applied the activation signal UPR-PGR.

There is now described the operation of the circuit 1 in accordance with an embodiment of the present invention starting from an initial state in which the node K is at a low logical value.

Under these conditions the capacitor Ca is charged at the reference power supply voltage Vdd to take to a high logical value the node A which turns off the transistor P6. At the same time there is also taken high the node X to turn off both the natural PMOS transistor P2 and the transistor P3.

The output terminal U1 is therefore held low by the coupling to the ground GND of the capacitor 31. The transistor P7 with its control terminal grounded immediately conducts and keeps the value of the node A high.

The network of transistors thus automatically deactivates the output U1 which can switch only when there is reached a relatively high voltage value by the activation signal UPR-PGR. This signal must have a value higher than the power supply voltage Vdd. The output U1 is connectable to the appropriate terminal of the configuration element 41 when the data stored is to be changed.

The second circuit portion 3 of the circuit 1 operates in a manner analogous to the above first circuit portion 2. When the node N has a low logical value the capacitor Cb is charged at the power supply voltage Vdd to take to a high logical value the node B which takes high the node L to turn off both the natural PMOS transistor P9 and the transistor P8.

The output terminal U2 is therefore kept low by the coupling to the ground GND of the capacitor 32. The transistor P11 with its control terminal grounded conducts immediately and keeps high the value of the node B.

The network of transistors of the second circuit portion 3 automatically deactivates the output terminal U2 which can switch only when there is reached a relatively high voltage value by the activation signal UPR-PGR. To free itself from this low value the output terminal U2 must overcome two thresholds of natural PMOS transistors such as the transistors P8 and P9. The output U2 is connectable to the appropriate terminals of the configuration element 41 when the data stored therein is to be changed.

Figure 2:
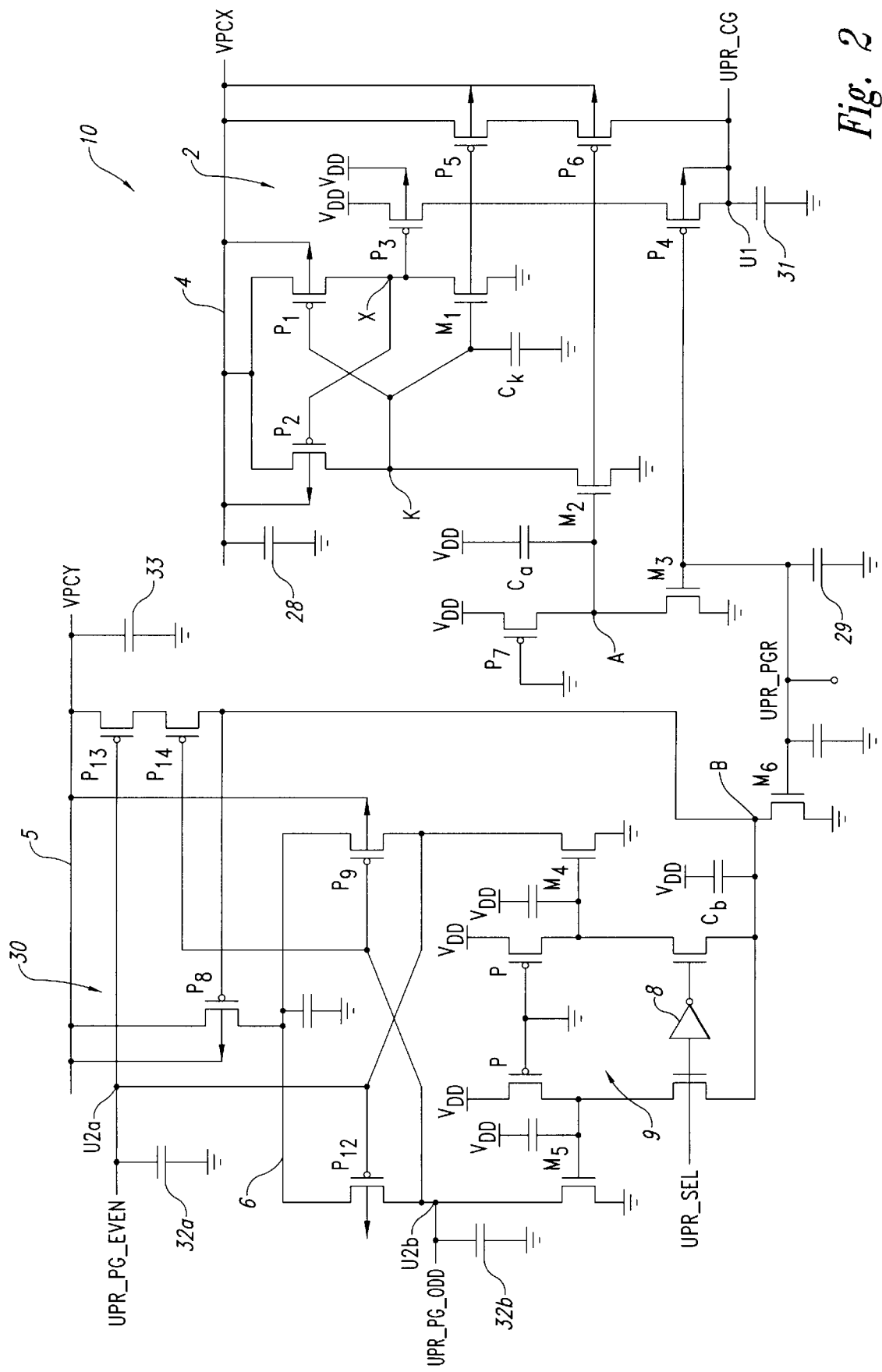
FIG. 2 shows a diagrammatic view of a second circuit in accordance with an embodiment of the present invention.

Now, with particular reference to the example of FIG. 2 there is described a second circuit in accordance with an embodiment of the present invention. In this example cooperating details and parts having the same structure and operation as the previous embodiment of the circuit 1 are indicated by the same reference numbers and symbols.

In FIG. 2 the circuit in accordance with another embodiment of the present invention is indicated by the reference number 10. The first circuit portion 2 has remained unchanged.

The second circuit portion is indicated by the reference number 30 and is structured in such a manner as to produce two distinct output signals, UPR-PG-EVEN and UPR-PG-ODD on respective output terminals U2a and U2b.

The second circuit portion 30 is susceptible of receiving another input signal UPR-SEL which allows selection of a right or left portion of configuration elements to be programmed.

The input signal UPR-SEL is applied to the input of an inverter 8 incorporated in a voltage booster block 9.

The block 9 is inserted between respective control terminals of two NMOS transistors M5 and M4 of a first and a second complementary pair of transistors incorporated centrally in the second circuit portion 30.

The booster block 9 comprises two complementary pairs of transistors.

Each pair in the block 9 comprises a PMOS transistor connected to the reference power supply voltage Vdd and an NMOS transistor connected to a drain terminal of the transistor M6. The PMOS transistors of the first and second pairs in the block 9 have respective control terminals grounded.

Between control terminals of the NMOS transistors of the first and second pairs in the block 9 is inserted an inverter 8.

An interconnection point between the PMOS and NMOS transistors of the first pair in the block 9 is connected to the control terminal of the transistor M5. An interconnection point between the PMOS and NMOS transistors of the second pair in the block 9 is connected to the control terminal of the transistor M4.

Between a control terminal of each of the transistors M5 and M4 and the reference power supply voltage Vdd is positioned a coupling capacitor P.

With respect to the second circuit portion 30 of the above embodiment the second circuit portion 30 has a PMOS transistor P12 of the natural type with a high threshold instead of the transistor P10 in the fourth pair of the circuit 1 shown in FIG. 1.

A control terminal of the transistor P12 is connected to the output terminal U2a.

The output terminal U2b of the second circuit portion 30 is connected with a control terminal of a transistor P9 of the second pair.

The output terminals U2a and U2b are also connected to respective control terminals of two pull-up PMOS transistors P13 and P14 connected between the line 5 having the voltage Vpcy and the node B which coincides with the drain terminal of the transistor M6.

Very briefly, the input signal UPR-SEL activates and deactivates alternately the branches of the second circuit portion 30.

In the block 9 the ground GND is not connected to output nodes of the block 9 so that through the coupling capacitors present on the control terminals of the transistors M5 and M4 these control terminals can rise towards the reference power supply voltage Vdd.

The node B is drawn towards the voltage Vpcy by the two pull-up PMOS transistors P13 and P14 and must overcome the resistance of these transistors to allow emission at output of a programming signal. The node B tends naturally to turn off the natural resistive transistor P8 which connects the lines 5 and 6.

Figure 3:
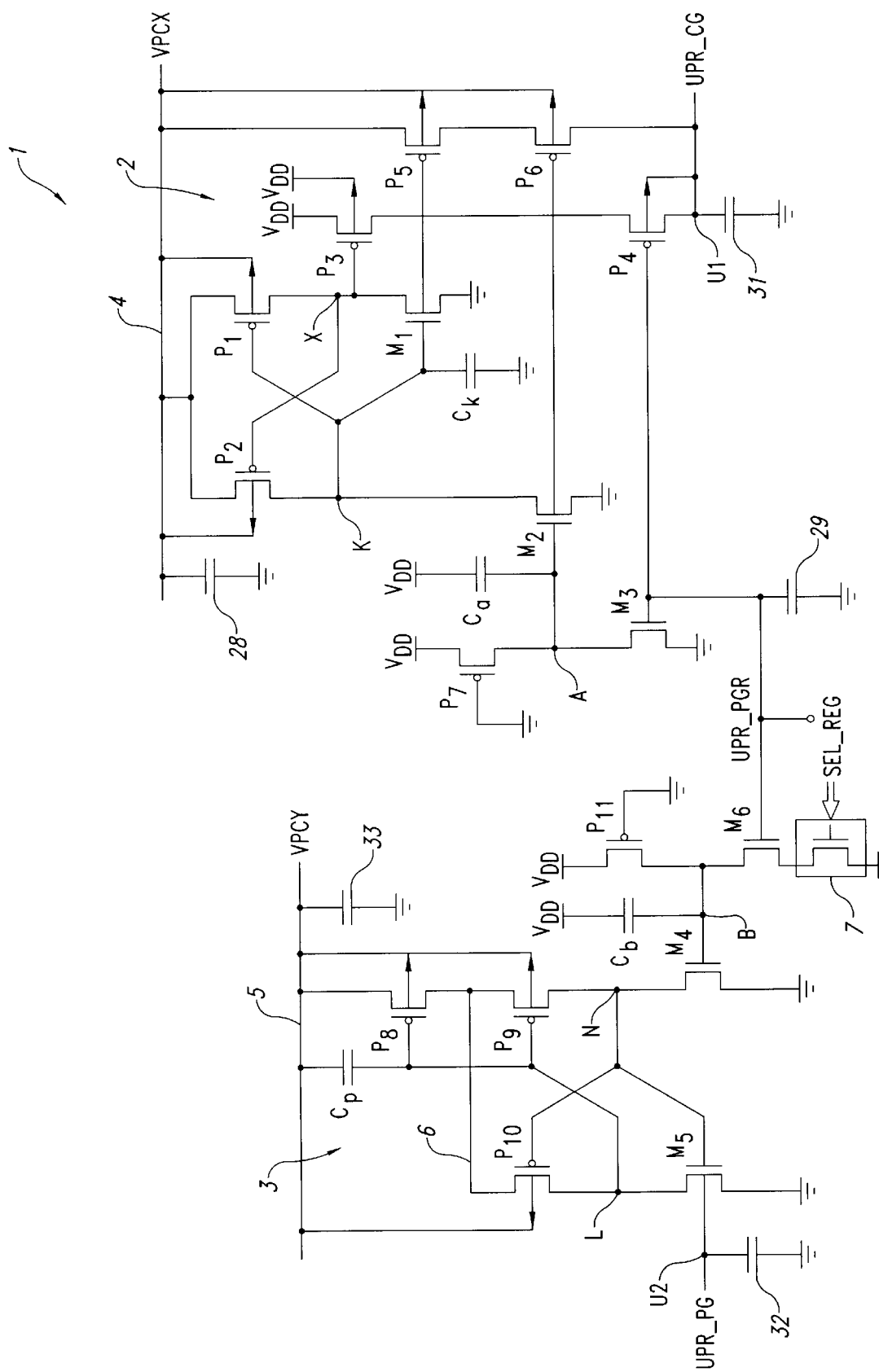
FIG. 3 shows a diagrammatic view of a variant of the circuit of FIG. 1 in accordance with an alternate embodiment of the invention.

FIG. 3 shows a variant of the circuit 1 shown in FIG. 1 in accordance with another embodiment of the present invention in which there has been provided a register selector 7 connected in series with the transistor M6. The proper number of register selector circuits 7 are provided corresponding to the number needed to select the desired number of registers.

This variant, according to the invention, finds a field of application in those cases in which the configuration elements to which the circuit is dedicated to protect and program are contained in registers addressable by groups.

Figure 4:
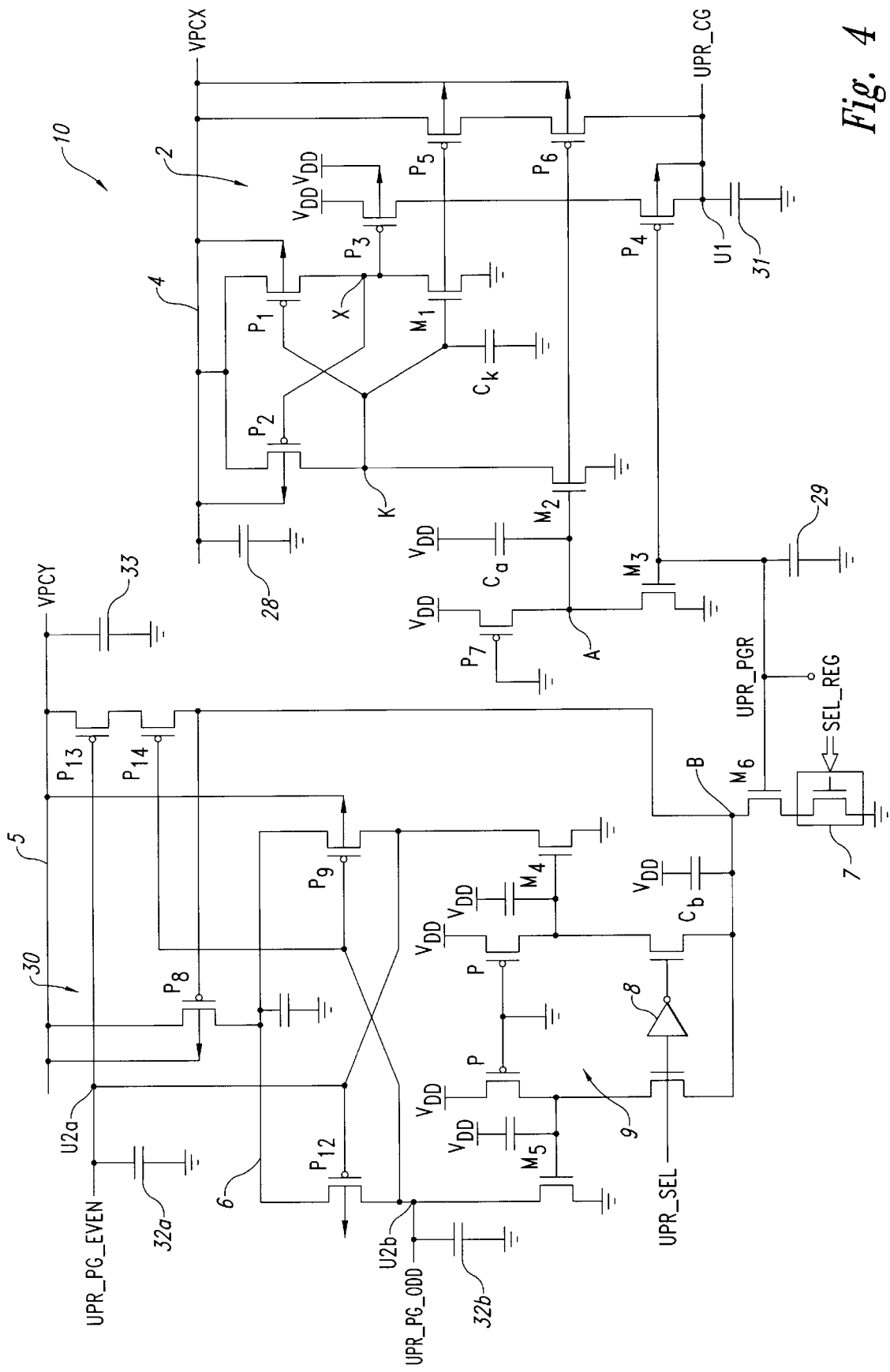
FIG. 4 shows a diagrammatic view of a variant of the circuit of FIG. 2 in accordance with an alternate embodiment of the invention.

FIG. 4 shows diagramatically an embodiment variant of the circuit of FIG. 2. Basically, the selector 7 of FIG. 3 has also been inserted in the circuit structure of the example of FIG. 2.

From the above considerations it is clear that the auto-saving circuit in accordance with the present invention solves the technical problem in a simple and effective manner to achieve numerous advantages.

In the first place, the circuits are powered by Vpcx and Vpcy voltage lines having filtering characteristics with respect to spurious power supply signals directed towards the memory cells matrix.

In the second place, the entire structure of the circuit 1 proves to be poorly reactive towards accidental and undesired modifications of the power supply voltage values. Basically, the circuit shows decided inertia to any type of sudden change. The memory cells connected to the respective output nodes of the circuit 1 are thus protected from accidental erasure or modifications.

The configuration of the circuit 1 is such that it shows a natural tendency to reach the state of deactivation.

The loads present in the circuit are intentionally weighted to achieve the above mentioned inertia.

The protective elements provided in the circuit in accordance with the present invention prevent dangerous overvoltages due to electrostatic discharges. There is no longer the risk of altering the information contained in the configuration elements, for example the UPROM cells, following a spurious programming of these elements.

Overall, the circuits in accordance with embodiments of the present invention have auto-saving characteristics which ensure avoidance of dangerous modifications of the configuration elements of the memory cells matrix.

It can be stated that the circuits in accordance with embodiments of the present invention achieve better protection of the programming circuits of the configuration elements thanks to the 'cascade' architecture of the power supply lines and to the inertia characteristics prevent spurious switching signals.

The circuit of FIG. 1 can be configured to have portions 2 and 3 connected to the same activation signal UPR-PGR as shown. In an alternative embodiment, the circuits 2 and 3 are not connected to a common activation line and may be used and activated independently. In these embodiments, the circuit 2 is connected to its dedicated activation signal UPR-PGR for separate control. The circuit portion 3 is either not present, or is controlled by a separate UPR-PGR signal on one of its dedicated lines.

What is claimed is:

1. An auto-saving circuit for programming configuration elements of nonvolatile memory cells in a cells matrix of a memory device integrated on a semiconductor chip, comprising:

a first circuit portion coupled to a first reference voltage, to a second reference voltage, to a first programming voltage, the first circuit portion including a switching network having at least one high threshold transistor and at least one decoupling element to provide inertia in response to variations in the first reference voltage, the second reference voltage, or the first programming voltage, the first circuit portion generating a first programming signal at a first output; and a second circuit portion coupled to the first reference voltage, to the second reference voltage and to a second programming voltage, the second circuit portion including a switching network having at least one high threshold transistor and at least one decoupling element to provide inertia in response to variations in the first reference voltage, the second reference voltage or the second programming voltage, the second circuit portion generating a second programming signal at a second output.

2. The auto-saving circuit of claim 1 wherein the switching network of the first circuit portion comprises first and second pairs of transistors with cross connections and the switching network of the second circuit portion comprises third and fourth pairs of transistors with crossed connections.

3. The auto-saving circuit of claim 1 wherein the first circuit portion and the second circuit portion are connected to an activation input receiving an activation signal, the activation signal enabling the first circuit portion to generate the first programming signal at the first output and enabling the second circuit portion to generate the second programming signal at the second output.

4. The auto-saving circuit of claim 1 wherein the at least one decoupling element in the first circuit portion is comprised of at least one capacitor connected to the switching network in the first circuit portion; and wherein the at least one decoupling element of the second circuit portion is comprised of at least one capacitor connected to the switching network in the second circuit portion.

5. The auto-saving circuit of claim 2 wherein the first pair of transistors comprises a first PMOS transistor having a control terminal and being coupled to the first programming voltage and a first NMOS transistor having a control terminal and being coupled to the second reference voltage, the first PMOS transistor being connected to the first NMOS transistor at a first node; and wherein the second pair of transistors comprises a second PMOS transistor having a high threshold and a control terminal and being coupled to the first programming voltage and a second NMOS transistor having a control terminal and being coupled to the second reference voltage, the second PMOS transistor being connected to the second NMOS transistor at a second node, the first node being connected to the control terminal of the second PMOS transistor and the second node being connected to the control terminals of the first PMOS transistor and the first NMOS transistor.

6. The auto-saving circuit of claim 2 wherein the third pair of transistors comprises a third PMOS transistor having a control terminal and being coupled to the second programming voltage and a third NMOS transistor having a control terminal and being coupled to the second reference voltage, the third PMOS transistor being connected to the third NMOS transistor at a third node; and wherein the fourth pair of transistors comprises a fourth PMOS transistor having a high threshold and a control terminal and being coupled to the second programming voltage and a fourth NMOS transistor having a control terminal and being coupled to the second reference voltage, the fourth PMOS transistor being connected to the fourth NMOS transistor at a fourth node, the third node being connected to the control terminal of the fourth PMOS transistor and the fourth node being connected to the control terminals of the third PMOS transistor and the third NMOS transistor.

7. A method for generating programming signals for programming configuration elements of non-volatile memory cells in a cells matrix of a memory device integrated on a semiconductor chip, comprising the steps of:

providing a first programming voltage to a switching network in a first circuit portion having at least one high threshold transistor;

decoupling the switching network in the first circuit portion with at least one decoupling element;

providing a second programming voltage to a switching network in a second circuit portion having at least one high threshold transistor;

decoupling the switching network in the second circuit portion with at least one decoupling element;

providing an activation signal to the first circuit portion and the second circuit portion;

generating a first programming signal at an output of the first circuit portion in response to the activation signal; and generating a second programming signal at an output of the second circuit portion in response to the activation signal.

8. The method of claim 7 wherein the step of decoupling the switching network in the first circuit portion comprises the step of connecting a capacitor to the switching network in the first circuit portion.

9. The method of claim 7 wherein the step of decoupling the switching network in the second circuit portion comprises the step of connecting a capacitor to the switching network in the second circuit portion.

10. An auto-saving circuit for programming configuration elements of non-volatile memory cells comprising:

a memory device having the non-volatile memory cells integrated on a semiconductor with said auto saving circuit connected to a first and a second power supply reference voltage and being powered also by programming voltages generated inside the memory device to produce output programming signals at a plurality of signal outputs for said configuration elements; and a first and a second circuit portion, one for each signal output powered each by one of said programming voltages and comprising each a switching network with at least one high threshold transistor and decoupling elements to give inertia to the circuit towards electrostatic discharges or accidental variations in the power supplies.

11. A circuit in accordance with claim 10 wherein a the switching network of the first circuit portion comprises first and second complementary pairs of transistors with a crossed connection.

12. A circuit in accordance with claim 11 wherein the first complementary pair comprises a transistor of the PMOS type powered by a first programming voltage and a transistor of the NMOS type connected to the second power supply reference voltage while the second complementary pair comprises a transistor of the PMOS type with a high threshold and powered by the first programming voltage and a transistor of the NMOS type connected to said second power supply reference voltage.

13. A circuit in accordance with claim 12 wherein an interconnection node between the transistors of the first complementary pair is connected to a control terminal of the PMOS transistor of the second complementary pair and that an analogous connection is provided between an interconnection node of the second complementary pair and control terminals of the transistors of the first complementary pair.

14. A circuit in accordance with claim 10 and characterized in that the switching network of the second circuit portion comprises first and second complementary pairs of transistors with a crossed connection.

15. A circuit in accordance with claim 13 wherein the first complementary pair comprises a transistor of the PMOS type powered by a second programming voltage and a transistor of the NMOS type connected to the second power supply reference voltage while the second complementary pair comprises a transistor of the PMOS type with a high threshold and powered by the second programming voltage and a transistor of the NMOS type connected to said second power supply reference voltage.

16. A circuit in accordance with claim 12 and characterized in that it comprises a third complementary pair of transistors receiving at an input a programming enablement signal and having an output node connected to a control terminal of the NMOS transistor of the second complementary pair.

17. A circuit in accordance with claim 13 and characterized in that it comprises at least one pair of transistors of the resistive PMOS type connected in series between the first power supply reference voltage and a signal output of the first circuit portion with a control terminal of one of said pair of transistors being connected to the interconnection node of the first complementary pair.

18. A circuit in accordance with claim 13 and characterized in that it comprises at least one pair of transistors of the resistive PMOS type connected in series with said first programming voltage and a signal output of the first circuit portion with a control terminal of one of said pair of transistors being connected to the interconnection node of the second complementary pair.

19. A circuit in accordance with claim 16 and characterized in that between the output node of said third complementary pair and the first power supply reference voltage is inserted a capacitor.

20. A circuit in accordance with claim 10 and characterized in that it comprises a capacitor for protection from overshoots between each circuit portion and a signal ground.

* * * * *